(12) United States Patent
Jeon et al.

(10) Patent No.: US 11,647,308 B2
(45) Date of Patent: May 9, 2023

(54) ANALOG-TO-DIGITAL CONVERTING CIRCUIT, IMAGE SENSING DEVICE AND OPERATION METHOD THEREOF

(71) Applicant: SK hynix Inc., Gyeonggi-do (KR)

(72) Inventors: Jin Uk Jeon, Gyeonggi-do (KR); Oh Jun Kwon, Gyeonggi-do (KR); Jin Seon Kim, Gyeonggi-do (KR); Hak Soon Kim, Gyeonggi-do (KR); Han Sang Kim, Gyeonggi-do (KR); Kang Bong Seo, Gyeonggi-do (KR); Sung Uk Seo, Gyeonggi-do (KR); Jeong Eun Song, Gyeonggi-do (KR); Min Seok Shin, Gyeonggi-do (KR); Sun Young Lee, Gyeonggi-do (KR); Eun Chang Lee, Gyeonggi-do (KR); Hoo Chan Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/574,181

(22) Filed: Jan. 12, 2022

(65) Prior Publication Data

US 2022/0368846 A1  Nov. 17, 2022

(30) Foreign Application Priority Data

May 12, 2021  (KR) .......................... 10-2021-0061502

(51) Int. Cl.
*H04N 5/3745* (2011.01)
*H04N 5/378* (2011.01)
*H03M 1/56* (2006.01)

(52) U.S. Cl.
CPC .............. *H04N 5/378* (2013.01); *H03M 1/56* (2013.01); *H04N 5/37455* (2013.01)

(58) Field of Classification Search
None
See application file for complete search history.

(56) References Cited

U.S. PATENT DOCUMENTS

| 9,451,193 B2 | 9/2016 | Yamagata et al. | |
| 2017/0195593 A1* | 7/2017 | Yeh | ....................... H04N 5/3745 |
| 2020/0003874 A1 | 1/2020 | Moriyama | |

* cited by examiner

*Primary Examiner* — Mark T Monk
(74) *Attorney, Agent, or Firm* — IP & T Group LLP (57) ABSTRACT

An analog-to-digital converting circuit includes: an analog-to-digital converter suitable for performing an analog-to-digital conversion on pixel signals of a plurality of pixels provided in a pixel array; a ramp signal generator suitable for providing a ramp signal to the analog-to-digital converter; and an auto-zero controller suitable for providing a reference voltage to the analog-to-digital converter to perform an auto-zeroing operation by using a row pixel for which a readout operation is performed by the analog-to-digital converter.

18 Claims, 5 Drawing Sheets

ANALOG-TO-DIGITAL CONVERTING CIRCUIT, IMAGE SENSING DEVICE AND OPERATION METHOD THEREOF

CROSS-REFERENCE TO RELATED APPLICATIONS

The present application claims priority to Korean Patent Application No. 10-2021-0061502, filed on May 12, 2021, which is incorporated herein by reference in its entirety.

BACKGROUND

1. Field

Various embodiments of the present invention relate to semiconductor designing technology, and more particularly, to an analog-to-digital converting circuit, an image sensing device, and a method for operating an image sensing device.

2. Description of the Related Art

Recently, the paradigm for a computer environment is shifting into ubiquitous computing, which allows users to access computer systems anywhere and anytime. The paradigm shift rapidly increases the use of portable electronic devices, such as mobile phones, digital cameras, laptop computers and the like.

In particular, with the rapid development of imaging devices, the development for image photographing devices, such as cameras and camcorders equipped with image sensors, is accelerating. Since an image photographing device is not only capable of capturing images and recording them in a recording medium but also reproducing the images at any time, the number of users is increasing rapidly. This also gradually increases the users' demands for performance and functions, and high performance and multi-functionalization are being pursued along with miniaturization, light weight, and low power consumption.

In such an image photographing device, an auto-zeroing operation needs to be performed to compensate for an offset of an analog-to-digital converter (ADC) before an analog-to-digital conversion. When a pixel operates in a 4-T (including 4 transistors) scheme, the pixel may be flushed out during a readout time and then an output of the pixel may be used as an auto-zeroing reference voltage. However, when a pixel operates in a 3-T (including three transistors) scheme, an auto-zeroing reference voltage has to be separately applied because the pixel cannot be flushed out during a pixel readout time. This requires more area due to the addition of a separate row pixel.

SUMMARY

Embodiments of the present invention are directed to providing an analog-to-digital converting circuit for generating, by using a previous row pixel on which a readout operation is completed, a reference voltage for an auto-zeroing operation; an image sensing device including the same; and a method for operating the image sensing device.

The technical problems desired to be achieved in the embodiments of the present invention are not limited to the technical problems mentioned above, and other technical problems not mentioned above may also be clearly understood by those of ordinary skill in the art to which the present invention pertains from the description below.

In accordance with an embodiment of the present invention, an analog-to-digital converting circuit includes: an analog-to-digital converter suitable for performing an analog-to-digital conversion on pixel signals of a plurality of pixels provided in a pixel array; a ramp signal generator suitable for providing a ramp signal to the analog-to-digital converter; and an auto-zero controller suitable for providing a reference voltage to the analog-to-digital converter to perform an auto-zeroing operation by using a row pixel for which a readout operation is performed by the analog-to-digital converter.

The auto-zero controller may block an auto-zero signal provided to the analog-to-digital converter so that a pixel signal of the row pixel for which the readout operation is completed is applied as an input signal to the analog-to-digital converter, and the ramp signal generator may provide an auto-zeroing reference voltage to another input terminal of the analog-to-digital converter.

The auto-zero controller may generate an initialization signal to initialize the auto-zeroing operation.

Each of the pixels may be formed of a three-transistor structure.

The analog-to-digital converter may include: a comparison unit suitable for comparing each pixel signal provided from the pixel array with the ramp signal provided from the ramp signal generator according to the auto-zero signal provided from the auto-zero controller; and a counting unit suitable for counting a clock according to each output signal from the comparison unit.

In accordance with another embodiment of the present invention, an image sensing device includes: a pixel array having a plurality of pixels for outputting a pixel signal corresponding to incident light; a row decoder suitable for selecting and controlling pixels in the pixel array for each row line; an analog-to-digital converter suitable for performing an analog-to-digital conversion on pixel signals of a plurality of pixels provided in the pixel array; a ramp signal generator suitable for providing a ramp signal to the analog-to-digital converter; an auto-zero controller suitable for providing a reference voltage to the analog-to-digital converter to perform an auto-zeroing operation by using a row pixel for which a readout operation is performed by the analog-to-digital converter; a controller suitable for controlling operations of the row decoder, the ramp signal generator, the analog-to-digital converter, and a column readout circuit; and the column readout circuit suitable for outputting pixel data under a control of the controller.

The analog-to-digital converter may include: a comparison unit suitable for comparing each pixel signal provided from the pixel array with the ramp signal provided from the ramp signal generator according to an auto-zero signal provided from the auto-zero controller; and a counting unit suitable for counting a clock according to each output signal from the comparison unit.

The auto-zero controller may block the auto-zero signal provided to the comparison unit so that a pixel signal of the row pixel is applied as an input signal of the comparison unit, and the ramp signal generator provides an auto-zeroing reference voltage to another input terminal of the comparison unit.

The auto-zero controller may generate an initialization signal to initialize the auto-zeroing operation.

The controller may increase a voltage of the ramp signal generator by a preset offset to convert the output of the comparison unit to a '+' state.

The controller may operate the analog-to-digital converter to store a conversion result of a reset voltage of a reset transistor of each pixel.

When a first row pixel among the pixels is a dummy row pixel, the auto-zero controller may block the auto-zero signal and perform an auto-zeroing operation on the first row pixel instead of the row pixel for which the readout operation is completed.

Each of the pixels may be formed of a three-transistor structure.

In accordance with yet another embodiment of the present invention, a method for operating an image sensing device in which a pixel signal provided from a pixel array including a plurality of pixels is converted through an analog-to-digital converter and output as a pixel data includes: performing a flushing operation of emptying a photodiode (PD) and a floating node (FD) by closing a switch of a reset transistor provided in each of the pixels; performing an integration operation of accumulating charges generated during exposure to light in the floating node by opening the switch of the reset transistor; and performing an auto-zeroing operation of providing a reference voltage by using a row pixel for which a readout operation is performed by the analog-to-digital converter among the pixels.

The performing of the auto-zeroing operation may include: applying a pixel signal of the row pixel for which the readout operation is completed as the reference voltage to an input terminal of the analog-to-digital converter and providing a ramp signal to another input terminal of the analog-to-digital converter by blocking an auto-zero signal provided to the analog-to-digital converter.

The performing of the auto-zeroing operation may further include: emptying the floating node by closing the switch of the reset transistor of the row pixel for which the readout operation is completed, while the switch of the selection transistor of the row pixel for which the readout operation is completed is closed.

The method may further include: generating an initialization signal to initialize the auto-zeroing operation.

The method may further include: increasing a voltage of the ramp signal by a preset offset to convert the output of the comparison unit to a '+' state.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or electrically connected to each other with another circuit intervening therebetween. In the present disclosure, the singular forms are intended to include the plural forms as well, unless the context clearly indicates otherwise.

Figure 1:
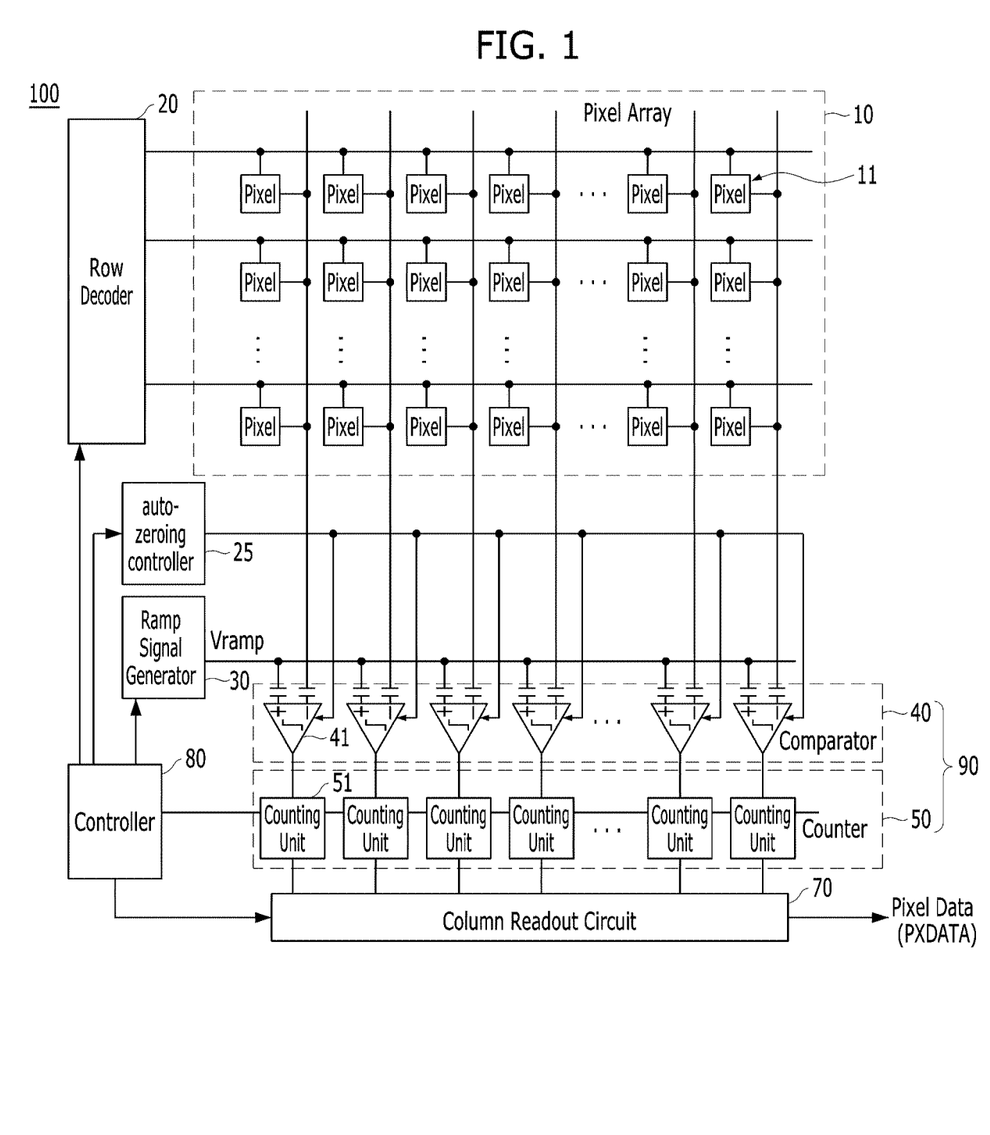
FIG. 1 is a block diagram illustrating an image sensing device in accordance with an embodiment of the present invention.
Figure 2:
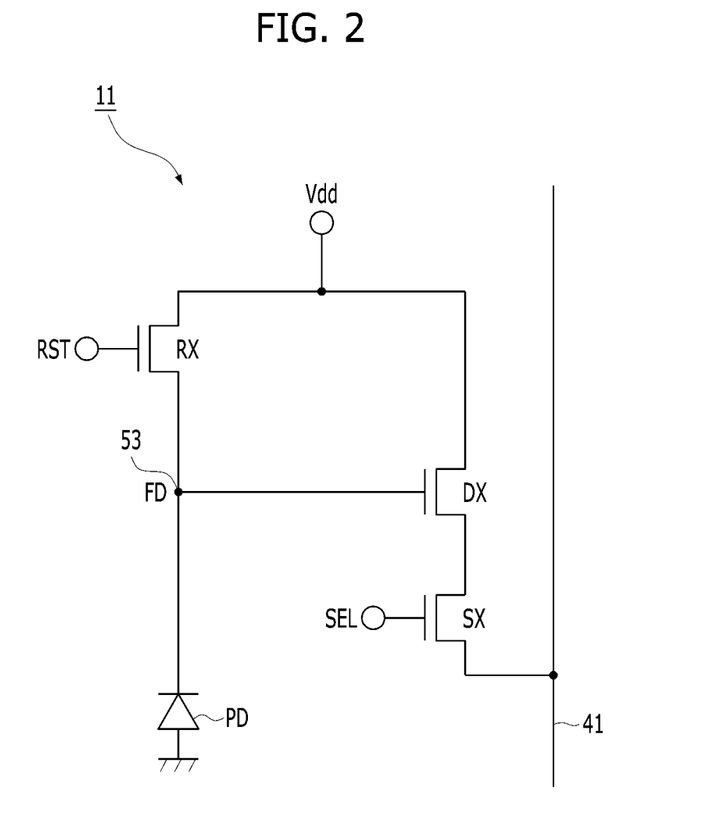
FIG. 2 is a circuit diagram illustrating a circuit in which the pixel shown in FIG. 1 has a 3T structure in accordance with an embodiment of the present invention.
Figure 3:
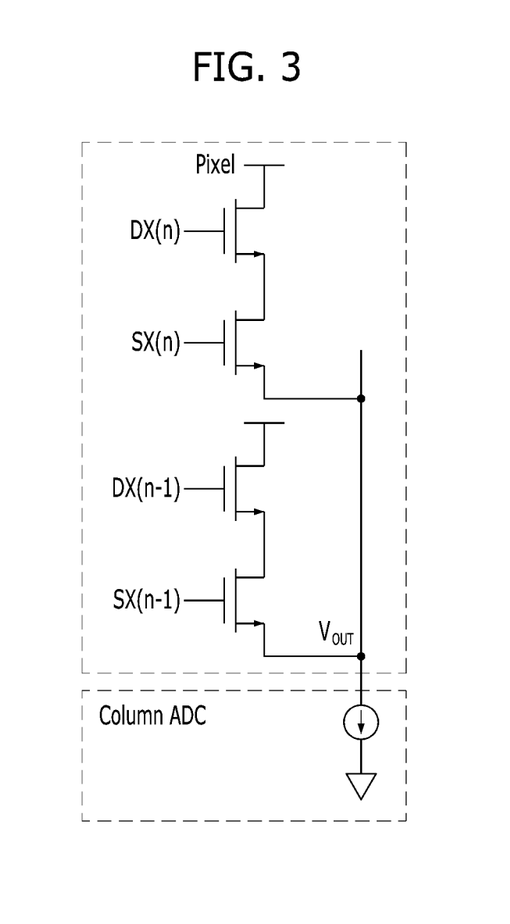
FIG. 3 is a circuit diagram illustrating a reference voltage which is provided from a previous pixel on which a readout operation is completed in a pixel array shown in FIG. 1 to an analog-to-digital converter in accordance with an embodiment of the present invention.

Hereafter, an image sensing device in accordance with an embodiment of the present invention will be described with reference to FIGS. 1 to 3. FIG. 1 is a block diagram illustrating an image sensing device 100 in accordance with an embodiment of the present invention. FIG. 2 is a circuit diagram illustrating a circuit in which the pixel shown in FIG. 1 has a 3T structure in accordance with an embodiment of the present invention. FIG. 3 is a circuit diagram illustrating a reference voltage which is provided from a previous pixel on which a readout operation is completed in a pixel array shown in FIG. 1 to an analog-to-digital converter in accordance with an embodiment of the present invention.

The image sensing device 100 shown in FIG. 1 may include a pixel array 10, a row decoder 20, an auto-zeroing controller 25, a ramp signal generator 30, a comparator 40, a counter 50, a column readout circuit 70, and a controller 80. In this case, the comparator 40 and the counter 50 may be included in an analog-to-digital converter 90.

The pixel array 10 may include a plurality of pixels 11 that output pixel signals corresponding to incident light.

In this embodiment of the present invention, as illustrated in FIG. 2, a 3T-type pixel structure including three transistors may be taken as an example.

In the 3T pixel structure shown in FIG. 2, the pixel 11 may include a photodiode PD, a reset transistor RX, an amplifying transistor DX and a selection transistor SX.

After the reset transistor RX is activated in response to a reset signal RST to reset a floating node FD, light may be accumulated in the floating node FD through the photodiode PD, and pixel signals may be output through a line 41 according to a selection signal SEL provided to the selection transistor SX.

Since the 3T pixel structure is a well-known technique widely known to those skilled in the art to which the present invention pertains, detailed operation description of the 3T pixel structure will be omitted.

The row decoder 20 may select a plurality of pixels in the pixel array 10 for each row line according to the control of the controller 80 and control the operation thereof. For example, a readout operation may be performed on the pixels on a row-by-row basis. That is, when a previous readout operation is completed on pixels of a previous row, a current readout operation may be performed on pixels of a row subsequent to the previous row.

A ramp signal Vramp, which is generated by the ramp signal generator 30, is provided to the analog-to-digital converter 90 as an auto-zeroing reference voltage under the control of the controller 80 so that the comparator 40 of the analog-to-digital converter 90 performs an auto-zeroing operation by using a previous row pixel on which a readout operation is completed among the pixels. That is, a pixel output from the previous row pixel is provided, as a reference voltage, to one input terminal of the comparator 40 while the ramp signal Vramp is provided, as the auto-zeroing reference voltage to the other input terminal of the comparator 40.

After the auto-zeroing operation is performed, the auto-zeroing controller 25 may block an auto-zeroing reference voltage provided to the comparator 40 so as to apply a pixel signal of the previous row pixel on which a readout operation is completed, as a reference signal, to one terminal of the comparator 40.

Herein, the auto-zeroing signal may be an operation signal according to an offset value for finely adjusting the ramp signal Vramp when a voltage level of the ramp signal Vramp generated by the ramp signal generator 30 is matched with a voltage level of the pixel signal Vp provided from the pixel array 10.

Also, the auto-zeroing controller 25 may generate an initialization signal to initialize the auto-zeroing operation of the comparator 40 under the control of the controller 80 and provide the initialization signal to the comparator 40.

The ramp signal generator 30 may generate and provide the ramp signal Vramp to the comparator 40. In particular, the ramp signal generator 30 may provide the ramp signal Vramp to the comparator 40 as an auto-zeroing reference voltage for an auto-zeroing operation.

Since the voltage level of the ramp signal Vramp decreases (or increases) as time passes, there is a moment when the values of two signals that are input to the comparator 40 coincide with each other. As the coincident moment passes, the value of a comparison signal output from the comparator 40 may be inverted.

After the auto-zeroing operation is completed according to the auto-zeroing signal provided from the auto-zeroing controller 25, the comparator 40 may be provided with a plurality of comparison units 41, and the comparator 40 may compare each pixel signal provided from the pixel array 10 with the ramp signal provided from the ramp signal generator so as to produce a comparison result, and output the comparison result as a logic high value or a logic low value.

In particular, the comparator 40 may receive the pixel signal of a previous row pixel on which a readout operation is completed under the control of the auto-zeroing controller 25 and compare it with the ramp signal provided from the ramp signal generator 30. The counter 50 may be provided with a plurality of counting units 51 and may count a clock according to each output signal from the comparator 40.

The counter 50 may count the clock from the controller 80 from a moment when the ramp signal Vramp falls (or rises) to a moment when the comparison signal output from the comparator 40 is inverted to output counting information. Herein, each counting unit may be initialized according to a reset signal from the controller 80.

The column readout circuit 70 may sequentially output the output signal of the counter 50 as pixel data PXDATA under the control of the controller 80.

The controller 80 may control the operations of the row decoder 20, the auto-zeroing controller 25, the ramp signal generator 30, the analog-to-digital converter, and the column readout circuit 70.

Also, the controller 80 may increase a ramp signal voltage of the ramp signal generator 30 by a preset offset and control the comparator 40 to compare the ramp signal Vramp and the pixel signal Vp with each other to switch the output of the comparator 40 to a logic high state.

Also, the controller 80 may operate the analog-to-digital converter 90 to store a conversion result of a voltage of the reset signal RST of the reset transistor RX of each pixel in a memory (not shown).

When the first row pixel among the pixels is a dummy row pixel, the auto-zeroing controller 25 may block the auto-zeroing signal and directly perform an auto-zeroing operation on the first row pixel of the pixel array instead of a previous row pixel. In this case, the dummy row pixel may be preset to have a preset value.

Figure 4:
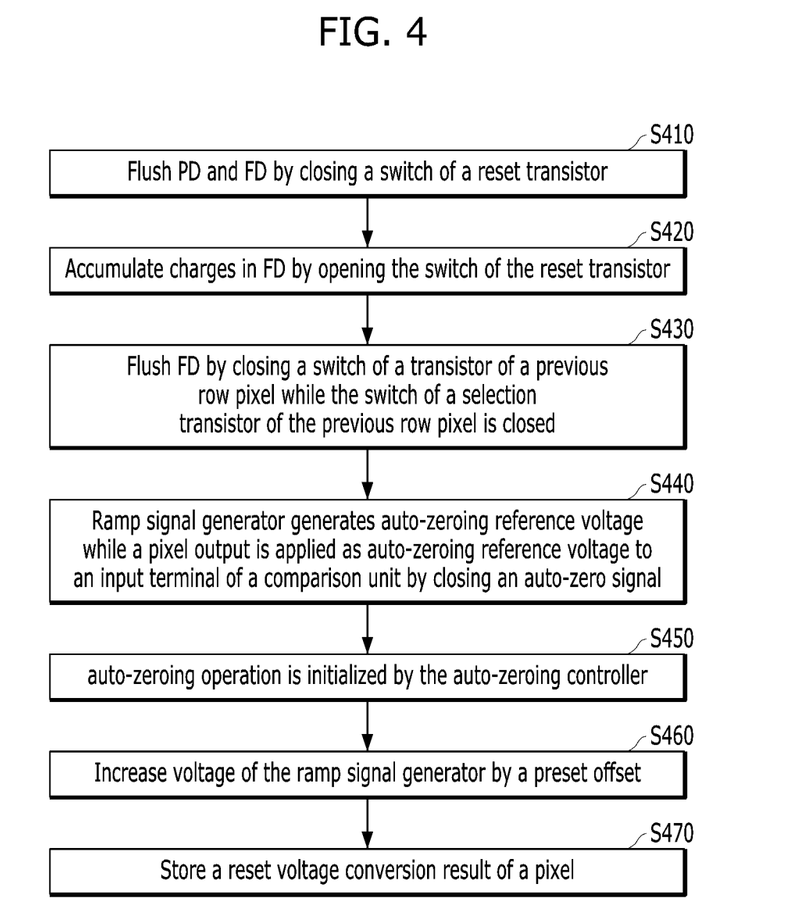
FIG. 4 is a flowchart describing an operation of an image sensing device in accordance with another embodiment of the present invention.

Hereinafter, a method for operating an image sensing device in accordance with an embodiment of the present invention will be described with reference to FIG. 4. FIG. 4 is a flowchart describing an operation of an image sensing device in accordance with another embodiment of the present invention.

As illustrated in FIG. 4, the operation of the image sensing device in accordance with the embodiment of the present invention may include operation S410 for performing a flushing operation on a plurality of pixels, operation S420 for performing an integration operation and operations S430 to S470 for performing a readout operation.

In operation S410, a flushing operation of flushing the photodiode PD and the floating node FD by closing the reset transistor RX provided in each of the pixels included in the pixel array 10 may be performed.

In operation S420, when the photodiode PD is exposed to a light, generated charges may be accumulated in the floating node FD by opening the reset transistor RX.

In the readout operation of operations S430 to S470, the reference voltage may be provided by using a previous row pixel on which a readout operation is completed by the analog-to-digital converter 90.

In operation S430, while the switch of the selection transistor SX of the previous row pixel is closed, the charges of the floating node FD may be flushed by closing the reset transistor RX of the previous row pixel.

In operation S440, a pixel output that is output from the previous pixel may be applied, as a reference voltage, to one input terminal of the comparator 40 of the analog-to-digital converter 90 by opening the switch of the reset transistor RX of the previous row and blocking the auto-zeroing signal, and the ramp signal generator 30 may apply the ramp signal to the other input terminal of the comparator 40 as an auto-zeroing reference voltage.

In operation S450, an initialization signal may be generated by the auto-zeroing controller to initialize an auto-zeroing operation.

In operation S460, the output of the comparator 40 may be switched to a logic high state by increasing the voltage of the ramp signal by a preset offset.

In operation S470, the conversion result of a voltage of the reset signal RST of the pixel 11 may be stored through an operation of the analog-to-digital converter.

When the first row pixel among the pixels is a dummy row pixel, the auto-zeroing signal may be blocked and the auto-zeroing operation of the first row pixel of the pixel array may be directly performed instead of a previous row pixel.

Figure 5:
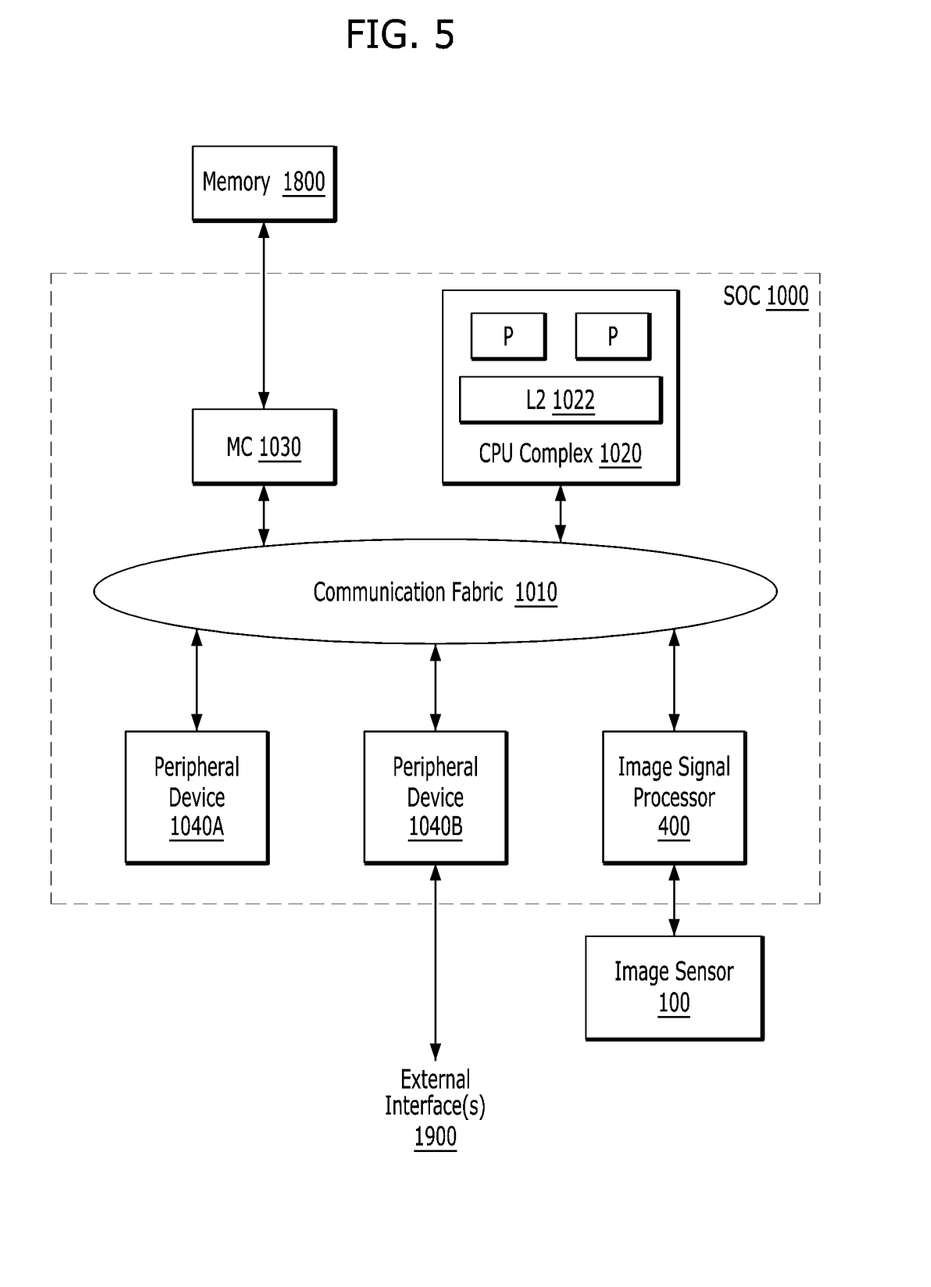
FIG. 5 is a block diagram illustrating an embodiment of a system to which an image sensing device according to an embodiment of the present invention is applied.

Hereinafter, referring to FIG. 5, an embodiment of a system to which an image sensing device in accordance with an embodiment of the present invention is applied will be described. FIG. 5 is a block diagram illustrating an embodiment of a system to which an image sensing device in accordance with an embodiment of the present invention is applied.

The system illustrated in FIG. 5 may be one among a personal computer system, a desktop computer, a laptop computer, a mainframe computer system, a handheld computing device, a cellular phone, a smart phone, a mobile phone, a workstation, a network computer, a consumer device, an application server, a storage device, an intelligent display, peripheral devices such as a switch, a modem, a router, etc., and general types of computing devices, but the present invention is not limited thereto and the system illustrated in FIG. 7 may be one among diverse types of computing devices.

The system illustrated in FIG. 5 may represent a System-On-a-Chip (SOC). As the name implies, the components of an SOC 1000 may be integrated over a single semiconductor substrate, such as the integrated circuit 'chips'. According to some embodiments of the present invention, the components may be realized over two or more separate chips in a system. Herein, the SOC 1000 will be used as an example.

According to the illustrated embodiment of the present invention, the components of the SOC 1000 may include a Central Processing Unit (CPU) complex 1020, On-Chip peripheral device components 1040A and 1040B (which may be simply referred to as 'peripheral devices'), a memory controller (MC) 1030, an image signal processor 400, and a communication fabric 1010.

The SOC 1000 may also be coupled to additional components, such as a memory 1800 and an image sensor 100. All of the components 1020, 1030, 1040A and 1040B, and 400 may be coupled to the communication fabric 1010. The memory controller 1030 may be coupled to the memory 1800 while it is being used, and the peripheral device 1040B may be coupled to an external interface 1900 while being used.

In the embodiment of the present invention, the CPU complex 1020 may include one or more processors 1024 and a level-2 cache L2 1022. The peripheral devices 1040A and 1040B may be a set of additional hardware functions included in the SOC 1000. For example, the peripheral devices 1040A and 1040B may include display controllers, Graphics Processing Units (GPUs), video encoders/decoders, scalers, rotators, blenders, etc., that are formed to display video data on one or more display devices.

The image signal processor 400 may process image capture data from the image sensor 100 (or another image sensor). As for the structure and operation of the image sensor 100, the structures and operations of the image sensor 100 shown in FIGS. 1 to 4 may be referred to. For example, the image sensor 100 may provide a reference voltage to the analog-to-digital converter to perform an auto-zeroing operation by using a previous row pixel on which a readout operation is completed by the analog-to-digital converter.

The peripheral devices may also include audio peripheral devices, such as microphones, speakers, interfaces with microphones and speakers, audio processors, digital signal processors, mixers, etc. The peripheral devices may include peripheral device interface controllers (for example, a peripheral device 1040B) for diverse interfaces 1900 in the outside of the SOC 1000 including Universal Serial Bus (USB), Peripheral Component Interconnect (PCI) including PCI Express (PCIe), serial and parallel ports, and the like. The peripheral devices may further include networking peripheral devices, such as media access controllers (MACs).

The CPU complex 1020 may include one or more CPU processors 1024 serving as a CPU of the SOC 1000. The CPU of the system may include processor(s) executing a main control software of a system, e.g., an operating system.

In general, software executed by the CPU during an operation may control the other components of the system to realize a predetermined function of the system. The processors 1024 may also execute other software, such as application programs. Application programs may provide a user with functions and may depend on the operating system for low-level device control. Accordingly, the processors 1024 may also be referred to as application processors.

The CPU complex 1020 may further include other hardware, such as an L2 cache 1022 and/or interfaces for other components of the system (e.g., interfaces for the communication fabric 1010).

Generally, a processor may include an arbitrary circuit and/or a microcode that is formed to execute commands defined in a command set architecture realized by a processor. Although the commands and data that are executed by processors may be generally stored in the memory 1800 in response to the execution of the commands, predetermined commands may also be defined for direct processor access to peripheral devices. The processors may include processor cores realized on an integrated circuit along with other components such as a System-On-Chip (SOC 1000), or integration of other levels. The processors may further include separate microprocessors, microprocessors integrated in processor cores and/or multi-chip module implementations, processors realized as multiple integrated circuits, and the like.

The memory controller 1030 may include a circuit that generally receives memory operation commands from the other components of the SOC 1000 and accesses the memory 1800 to complete the memory operations. The memory controller 1030 may be formed to access the memory 1800 of an arbitrary type. For example, the memory 1800 may be a Static Random Access Memory (SRAM), or a Synchronous Dynamic Random Access Memory (SDRAM) including a DRAM such as Double Data Rate (DDR, DDR2, DDR3, etc.) DRAM. Low power/mobile versions of DDR DRAM (e.g., LPDDR, mDDR, etc.) may be supported. The memory controller 1030 may include queues for memory operations that direct (and potentially redirect) and present operations to the memory 1800. The memory controller 1030 may further include data buffers that store write data waiting to be written into the memory and read data waiting to return into the source of the memory operation.

According to some embodiments of the present invention, the memory controller 1030 may include a memory cache that stores recently accessed memory data. In the implementation of the SOC, the memory cache may reduce the power ratio in the SOC by avoiding re-accessing the data from the memory 1800 when it is expected to be accessed again soon. In some cases, the memory cache may be referred to as a system cache, such as private caches that supports only predetermined components, e.g., the L2 cache 1022 of the processors 1024. According to some embodiments of the present invention, the system cache may not have to be positioned in the inside of the memory controller 1030.

According to the embodiment of the present invention, the memory 1800 may be packaged along with the SOC 1000 in the form of a chip-on-chip or package-on-package. A multi-chip module structure of the SOC 1000 and the memory 1800 may also be used.

Thus, while protection data may be stored unencrypted in the memory 1800, the protection data may be encrypted to be exchanged between the SOC 1000 and external endpoints.

The communication fabric 1010 may be an arbitrary communication interconnect and protocol for communication among the components of the SOC 1000. The communication fabric 1010 may be based on a bus including hierarchical buses with shared bus elements, cross bar elements, and bridges. The communication fabric 1010 may also be based on packets and it may be a layer with a bridge, a cross bar, a point-to-point connection, or other interconnects.

The methods described in this specification may be realized by a computer program product, or software. According to some embodiments of the present invention, a non-transitory computer-readable storage medium may program a computer system (or other electronic devices) and may store commands that may be used to execute some or all of the techniques described herein. A computer-readable storage medium may include an arbitrary mechanism for storing information in a form (e.g., software and processing application) readable by machine (e.g., a computer). The machine-readable medium may include a magnetic storage medium (e.g., a floppy diskette); an optical storage medium (e.g., CD-ROM); a magneto-optical storage medium; a Read Only Memory (ROM); a Random Access Memory (RAM); an Erasable and programmable memory (e.g., EPROM and EEPROM); a flash memory; and other types of media appropriate for storing electricity or program commands, but the concept and spirit of the present invention are not limited thereto. In addition, the program commands may be communicated by using light, sound, or other forms of propagated signals (e.g., carrier waves, infrared signals, digital signals, etc.).

The computer system 1000 may include one or more modules, for example, a processor unit 1020 (possibly multiple processors, a single-threaded processor, a multi-threaded processor, a multi-core processor, etc.) that may exist in the program commands stored in the memory 1800 of the same computer system, or that may exist in the program commands stored in the memory of a system which is similar to or different from the computer system 1000, in order to execute some or all of the techniques described herein.

According to the embodiment of the present invention, a reference voltage may be provided to an analog-to-digital converter to perform an auto-zeroing operation by using a previous row pixel on which a readout operation is completed by the analog-to-digital converter included in an analog-to-digital converting circuit.

Therefore, no additional separate row pixels are required for an auto-zeroing operation and thus an area may be reduced within the analog-to-digital converting circuit.

Also, since utilized for the auto-zeroing operation may be a previous row pixel on which a readout is completed and adjacent to a row pixel currently being readout, the analog-to-digital converting circuit may be less affected by IR drop.

The effects desired to be obtained in the embodiments of the present invention are not limited to the effects mentioned above, and other effects not mentioned above may also be clearly understood by those of ordinary skill in the art to which the present invention pertains from the description below.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. An analog-to-digital converting circuit, comprising:
   an analog-to-digital converter suitable for performing an analog-to-digital conversion on pixel signals of a plurality of pixels provided in a pixel array;
   a ramp signal generator suitable for providing a ramp signal to the analog-to-digital converter; and
   an auto-zeroing controller suitable for providing an auto-zeroing reference voltage to the analog-to-digital converter to perform an auto-zeroing operation by using a row pixel of the plurality of pixels on which a readout operation is completed by the analog-to-digital converter.

2. The analog-to-digital converting circuit of claim 1,
   wherein the auto-zeroing controller is further suitable for blocking the auto-zeroing reference voltage provided to the analog-to-digital converter so that the pixel signal of the row pixel on which the readout operation is completed is applied, as the auto-zeroing reference signal, to one input terminal of the analog-to-digital converter, and
   wherein the ramp signal generator provides the ramp signal, as the auto-zeroing reference voltage, to the other input terminal of the analog-to-digital converter.

3. The analog-to-digital converting circuit of claim 2, wherein the auto-zeroing controller is further suitable for generating an initialization signal to initialize the auto-zeroing operation.

4. The analog-to-digital converting circuit of claim 1, wherein each of the pixels is formed of a three-transistor structure.

5. The analog-to-digital converting circuit of claim 1, wherein the analog-to-digital converter includes:
   a comparator suitable for comparing each pixel signal provided from the pixel array with the ramp signal provided from the ramp signal generator according to the auto-zeroing reference voltage provided from the auto-zeroing controller; and
   a counter suitable for counting a clock according to each output signal from the comparator.

6. An image sensing device, comprising:
   a pixel array having a plurality of pixels for outputting pixel signals corresponding to incident light;
   an analog-to-digital converter suitable for performing an analog-to-digital conversion on the pixel signals of the plurality of pixels on a row-by-row basis;
   a ramp signal generator suitable for providing a ramp signal to the analog-to-digital converter;
   an auto-zeroing controller suitable for providing a reference voltage to the analog-to-digital converter to perform an auto-zeroing operation by using a row pixel on which a readout operation is completed by the analog-to-digital converter; and
   a column readout circuit suitable for outputting pixel data under a control of the controller.

7. The image sensing device of claim 6, wherein the analog-to-digital converter includes:
   a comparator suitable for comparing each pixel signal provided from the pixel array with the ramp signal provided from the ramp signal generator according to an auto-zeroing signal provided from the auto-zeroing controller; and
   a counter suitable for counting a clock according to each output signal from the comparator.

8. The image sensing device of claim 7,
   wherein the auto-zeroing controller is further suitable for blocking the auto-zeroing signal provided to the comparator so that the pixel signal of the row pixel is applied, as the reference signal, to one input terminal of the comparator, and wherein the ramp signal generator provides the ramp signal, as an auto-zeroing reference voltage, to the other input terminal of the comparator.

9. The image sensing device of claim 7, wherein the auto-zeroing controller is further suitable for generating an initialization signal to initialize the auto-zeroing operation.

10. The image sensing device of claim 9, further comprising a controller suitable for increasing a voltage of the ramp signal generator by a preset offset to convert the output of the comparator to a logic high state.

11. The image sensing device of claim 9, further comprising a controller suitable for operating the analog-to-digital converter to store, in a memory, a conversion result of a reset voltage of a reset transistor of each pixel.

12. The image sensing device of claim 6, wherein when a first row pixel among the pixels is a dummy row pixel, the auto-zeroing controller blocks the auto-zeroing signal and performs an auto-zeroing operation on the first row pixel instead of the row pixel on which the readout operation is completed.

13. The image sensing device of claim 6, wherein each of the pixels is formed of a three-transistor structure.

14. A method for operating an image sensing device in which a pixel signal provided from a pixel array including a plurality of pixels is converted through an analog-to-digital converter and output as a pixel data, the method comprising:

performing a flushing operation of flushing a photodiode and a floating node in each of the pixels by closing a reset transistor provided in each of the pixels;

performing an integration operation of accumulating, in the floating node, charges generated during exposure to light by opening reset transistor; and performing an auto-zeroing operation of providing an auto-zeroing reference voltage by using a row pixel of the plurality of pixels on which a readout operation is completed by the analog-to-digital converter among the pixels.

15. The method of claim 14, wherein the performing of the auto-zeroing operation includes applying, as the reference voltage, a pixel signal of the row pixel on which the readout operation is completed to one input terminal of the analog-to-digital converter by blocking an auto-zeroing signal provided to the analog-to-digital converter, and wherein the performing of the auto-zeroing operation further includes providing a ramp signal, as an auto-zeroing reference signal, to the other input terminal of the analog-to-digital converter.

16. The method of claim 15, wherein the performing of the auto-zeroing operation further includes flushing the floating node of the row pixel on which the readout operation is completed by closing the reset transistor of the row pixel on which the readout operation is completed while a selection transistor of the row pixel on which the readout operation is completed is closed.

17. The method of claim 16, further comprising generating an initialization signal to initialize the auto-zeroing operation.

18. The method of claim 16, further comprising increasing a voltage of the ramp signal by a preset offset to convert output of a comparator to a logic high state.

* * * * *